(12) United States Patent
Asai

(10) Patent No.: US 7,889,529 B2
(45) Date of Patent: Feb. 15, 2011

(54) POWER CONVERTER

(75) Inventor: Takamasa Asai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 619 days.

(21) Appl. No.: 11/910,179

(22) PCT Filed: Dec. 7, 2006

(86) PCT No.: PCT/JP2006/324468
§ 371 (c)(1),
(2), (4) Date: Sep. 28, 2007

(87) PCT Pub. No.: WO2007/069530
PCT Pub. Date: Jun. 21, 2007

(65) Prior Publication Data
US 2009/0052211 A1 Feb. 26, 2009

(30) Foreign Application Priority Data
Dec. 12, 2005 (JP) .............................. 2005-357656

(51) Int. Cl.
H02M 7/5387 (2007.01)
(52) U.S. Cl. ....................... 363/132; 323/284; 327/434; 327/448
(58) Field of Classification Search ................. 363/132, 363/98, 16; 323/284; 327/434, 448
See application file for complete search history.

(56) References Cited

U.S. PATENT DOCUMENTS

| 6,275,399 | B1 * | 8/2001 | Miyazaki et al. ............... 363/98 |
| 7,129,759 | B2 * | 10/2006 | Fukami ....................... 327/110 |
| 7,310,006 | B2 * | 12/2007 | Shimada ....................... 326/83 |
| 2002/0110008 | A1 | 8/2002 | Miyazaki et al. |
| 2005/0168264 | A1 | 8/2005 | Fukami |

FOREIGN PATENT DOCUMENTS

| JP | 6-326579 A | 11/1994 |
| JP | 2001-217697 A | 8/2001 |
| JP | 2001-245466 A | 9/2001 |
| JP | 2005-45905 A | 2/2005 |
| JP | 2005-223399 A | 8/2005 |
| JP | 2006-148323 A | 6/2006 |

* cited by examiner

Primary Examiner—Jessica Han
(74) Attorney, Agent, or Firm—Sughrue Mion, PLLC

(57) ABSTRACT

In a bridge type power converter including series connectors of power semiconductor switches having first and second main terminals and a control terminal; plural steps of the series connectors connected in parallel, a gate drive circuit for limiting voltage between the first and second main terminals of the power semiconductor switch to a predetermined value only in turning off the power semiconductor switch is provided between the first main terminal and the control terminal of the power semiconductor switch.

6 Claims, 7 Drawing Sheets

POWER CONVERTER

TECHNICAL FIELD

The present invention relates to a power converter using a semiconductor switching element, particularly, a bridge type power converter for converting direct current power of a battery or the like into polyphase alternating current power to drive an electric rotating machine.

BACKGROUND ART

In a power converter using a semiconductor switching element, in the case that a semiconductor switching element, which is on, is turned off to cut off an electric current when the electric current flows from a direct current power supply in a forward direction of the semiconductor switching element (a direction from a drain to a source in the case of a MOS-FET, for example), generated is surge voltage between main terminals of the semiconductor switching element, which has been turned off, due to parasitic inductance of a power supply line. The surge voltage exceeding resistance pressure of the semiconductor switching element causes a break of the element. Accordingly, various kinds of surge voltage suppression means have been proposed up to now.

JP-A-H06-326579 (refer to Patent Reference 1) discloses an example of a conventional surge voltage suppression means. In the above means, a series circuit of a voltage regulation diode and a reverse blocking diode is connected as a gate drive circuit between a gate terminal and a drain terminal of a MOS-FET in order to limit surge voltage generated between the drain terminal and the source terminal of the MOS-FET to the predetermined voltage. When the MOS-FET is off-driven and the current flowing to a load is cut off, parasitic inductance of a power supply line causes surge voltage between the drain terminal and the source terminal of the MOS-FET. The surge voltage exceeding the sum of breakdown voltage of the voltage regulation diode and forward direction voltage of the reverse blocking diode causes an electric current to flow from a drain to a gate of the MOS-FET to turn on the MOS-FET. This allows the MOS-FET to absorb energy of parasitic inductance while the surge voltage is limited to the predetermined voltage.

In the case of applying the conventional gate drive circuit of a semiconductor switching element to a polyphase bridge type power converter, however, energy of parasitic inductance consumed in turning off a semiconductor switch in respective phases concentrates on a semiconductor switching element in a specific phase in accordance with dispersion of characteristics of the voltage regulation diode. This causes possibility of an overheat break due to an increase in loss.

Further, uneven loss of the respective semiconductor switching elements requires heat design carried out so as to correspond to a semiconductor switching element having the greatest loss. This causes a problem that a heat dissipation circuit of the power converter to be made large, which goes against the times of miniaturization and lightening of weight in a field of devices for a vehicle.

Now, a case shown in FIGS. 9 to 11 that the gate drive circuit is applied to a power converter for a vehicle will be exemplified to describe problems in the prior art in detail. FIG. 9 illustrates a whole structure of a system for converting direct current power of a battery 90 into three-phase alternating current power by means of a power converter 70 to drive a motor generator 80 so as to drive an engine and for rectifying and converting by means of the power converter 70 three-phase alternating current power, which is caused by rotation of the motor generator 80 in accordance with a drive of the engine, into direct current power. Ldc denotes parasitic inductance of wiring of a direct current power supply line between the battery 90 and the power converter 70.

A field system circuit, a sensor circuit and such are omitted from drawing. The power converter 70 is a three-phase bridge circuit comprising N-channel type power MOS-FETs 30a to 30f. The battery 90 is connected between a high voltage side direct current terminal P and a low voltage side direct current terminal N of the power converter 70. Alternating current terminals U, V and W connected to middle points of respective phases (a phase U, a phase V and a phase W) of the three-phase bridge are respectively connected to stator windings U, V and W of the motor generator 80. Power MOS-FETs 50a to 50f are connected to the gate drive circuits 30a to 30f and further to a control circuit 40 upstream from the gate drive circuits.

FIG. 10 illustrates an inner circuit of the gate drive circuit 30a in FIG. 9. A gate driver 20 drives the power MOS-FET 50a through a gate resistance Rg in accordance with an on-off control signal UH of the control circuit 40. Between a gate terminal and a drain terminal of the power MOS-FET 50a, connected is a series circuit of a voltage regulation diode Z1a and a reverse blocking diode D1. The insides of the other gate drive circuits 30b to 30f in FIG. 9 are similar to the circuitry in FIG. 10. It is assumed that Z1b to Z1f denote respective voltage regulation diodes and that breakdown voltages of voltage regulation diodes Z1c and Z1d of the gate drive circuits 30c and 30d in the phase V are smaller than those of the voltage regulation diodes Z1a, Z1b, Z1e and Z1f in the other phases by several volts.

FIG. 11 shows operation waveforms in the case that a rectangular wave controls signal having an energizing angle of 180 degrees is outputted from the control circuit 40 and alternating current power having a predetermined frequency is given to the motor generator 80 for a drive in FIG. 9. UH, UL, VH, VL, WH and WL denote on-off control signals of the respective power MOS-FETs 50a to 50f, which are outputted from the control circuit 40. A signal at a high level means an instruction of "on" while a signal at a low level means an instruction of "off". Time for preventing short circuit (dead time) is provided in timing of switching on and off a control signal. Vpn denotes a voltage between the terminal P and the terminal N of the power converter 70. Vgs (50a), Vgs (50b), Vgs (50c), Vgs (50d), Vgs (50e) and Vgs (50f) respectively denote voltages between gates and sources of the power MOS-FETs 50a to 50f. A section of a middle voltage shows the gate drive circuits 30a to 30f operating so as to limit the surge voltage due to the parasitic inductance Ldc to a predetermined value.

Now, described will be an operation in FIG. 11. When Vgs (50c) decreases on the basis of an instruction of turning off in accordance with VH to turn off the power MOS-FET 50c, for example, surge voltage due to the parasitic inductance Ldc is generated between the drain and the source of the power MOS-FET 50c while surge voltage at the substantially same level is generated for Vpn. The surge voltage exceeding the sum of breakdown voltage of the voltage regulation diode Z1c of the gate drive circuit 30c and forward direction voltage of the reverse blocking diode D1 causes Vgs (50c) to slowly decrease in the vicinity of an on-threshold value of the power MOS-FET 50c. The surge voltage is then limited to a predetermined level of the gate drive circuit 30c while the power MOS-FET 50c absorbs energy of the parasitic inductance Ldc. That is to say, the power MOS-FET 50c, which has been turned off, absorbs the energy of the parasitic inductance Ldc.

When the MOS-FETs 50b and 50e are turned off on the basis of instructions of turning off in accordance with UL and WH to generate surge voltage to Vpn, however, the gate drive circuit 30c of the power MOS-FET 50c, which has been turned off, in the phase V where breakdown voltage of the voltage regulation diode is low responds first to the generated surge voltage. As a result, Vgs (50c) rises to the vicinity of the on-threshold of the power MOS-FET 50c to turn on the power MOS-FET 50c. The surge voltage is then limited to a predetermined level of the gate drive circuit 30c while the power MOS-FET 50c absorbs energy of the parasitic inductance Ldc. That is to say, MOS-FET 50c, which is controlled by the gate drive circuit 30c having low breakdown voltage of the voltage regulation diode, instead of the power MOS-FETs 50b and 50e, which have been turned off, absorbs energy of the parasitic inductance Ldc. Similarly, the power MOS-FET 50d absorbs energy of the parasitic inductance Ldc, which is consumed in turning off the power MOS-FETs 50a, 50d and 50f.

As described above, it can be considered that a power MOS-FET in a specific phase, which is controlled by a gate drive circuit having low breakdown voltage of a voltage regulation diode, absorbs not only the energy of the parasitic inductance Ldc, which is consumed in turning off the power MOS-FET in the self phase, but also all energy of the parasitic inductance Ldc, which is consumed in turning off the power MOS-FET in the other phases, in accordance with a state of dispersion of the breakdown voltage of the voltage regulation diode forming the gate drive circuit. The power MOS-FET in the specific phase is likely to be led to an overheat break due to an increase in loss. Further, uneven loss of the respective semiconductor switches causes necessity of heat design corresponding to a semiconductor switch having the greatest loss. This causes a large-scaled heat dissipation circuit of a power converter.

DISCLOSURE OF THE INVENTION

Problems to be Solved by the Invention

The invention is to solve the above problems. An object of the invention is to provide a gate drive circuit of a semiconductor switch for operating in no response to the surge voltage in turning off of the power MOS-FET in the other phases but in response to only the surge voltage generated in turning off the power MOS-FET in the self phase.

Means to Solve the Problems

The invention is a bridge type power converter including series connectors of power semiconductor switches having first and second main terminals and a control terminal, plural stages of the series connectors connected in parallel, the power converter characterized in that a gate drive circuit for limiting voltage between the first and second main terminals of the power semiconductor switch to a predetermined value only in turning off the power semiconductor switch is provided between the first main terminal and the control terminal of the power semiconductor switch.

ADVANTAGE OF THE INVENTION

A power semiconductor switch having been turned off only absorbs energy of the parasitic inductance of a direct current power supply line, which is consumed in turning off the respective power semiconductor switches. Accordingly, the respective power semiconductor switches have no loss due to turning off the power semiconductor switches in the other phases even in the case of dispersion between phases in the predetermined limit voltage of the respective gate drive circuits. This allows an overheat break due to concentration of losses to be prevented. Moreover, uniform losses cause the maximum loss per power semiconductor switch to be made small, so that a heat dissipation circuit of a power converter can be miniaturized.

BEST MODE FOR CARRYING OUT THE INVENTION

Embodiment 1

Figure 1:
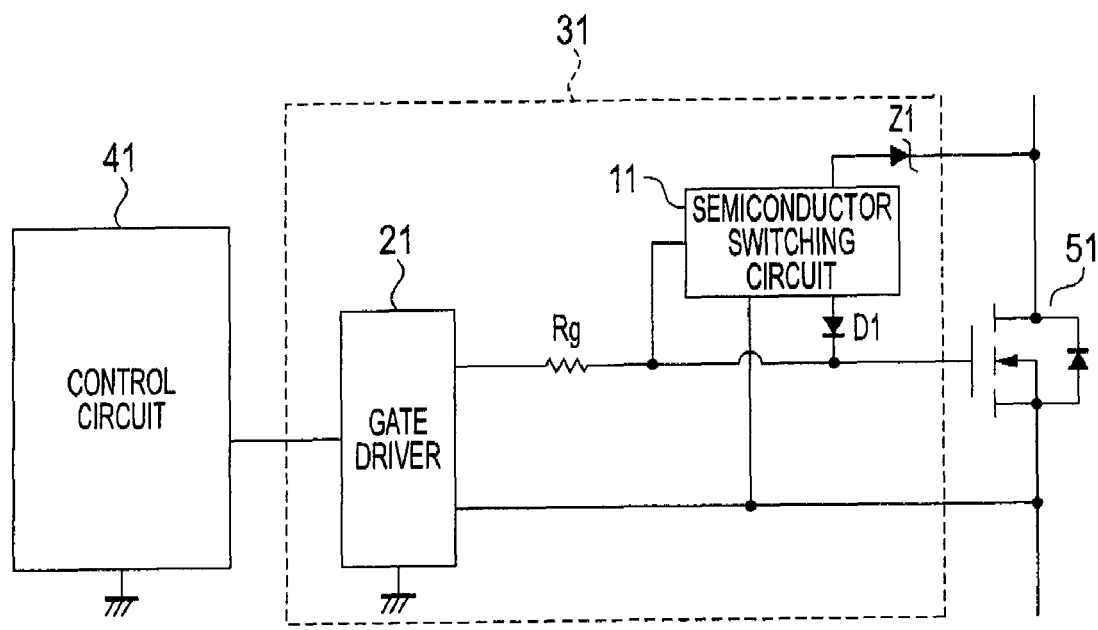
FIG. 1 is a block diagram showing a gate drive circuit of a semiconductor switch in accordance with Embodiment 1 of the invention and a peripheral structure thereof.

Now, embodiments of the invention will be described hereinafter, made reference to the drawings. In the following description, the same components are marked with the same reference signs and numerals. FIG. 1 is a block diagram showing a gate drive circuit of a semiconductor switch in accordance with Embodiment 1 of the invention and a peripheral structure thereof. In FIG. 1, extracted is a semiconductor switch portion forming a polyphase bridge type power converter. In FIG. 1, a semiconductor switch 51 is an N-channel type power MOS-FET (referred to as a power MOS-FET 51, hereinafter) and driven to be turned on and off by means of a gate drive circuit 31 connected between the power MOS-FET 51 and a control circuit 41.

Now, described will be an inner structure of the gate drive circuit 31. A gate driver 21 converts an on-off control signal, which is based on a standard of GND potential from the control circuit 41, into a signal level, which is based on a standard of a source terminal of the power MOS-FET 51, and amplifies driving force to supply voltage between a gate terminal and the source terminal of the power MOS-FET 51 through a gate resistance Rg so as to carry out an on-off drive. Further, a drain terminal of the power MOS-FET 51 is connected to a cathode terminal of a voltage regulation diode Z1 while the gate terminal is connected to a cathode terminal of a reverse blocking diode D1. Between an anode terminal of the voltage regulation diode Z1 and an anode terminal of the reverse blocking diode D1, connected is a semiconductor switch circuit 11 controlled in accordance with the voltage between the gate and the source of the power MOS-FET 51.

Figure 2:
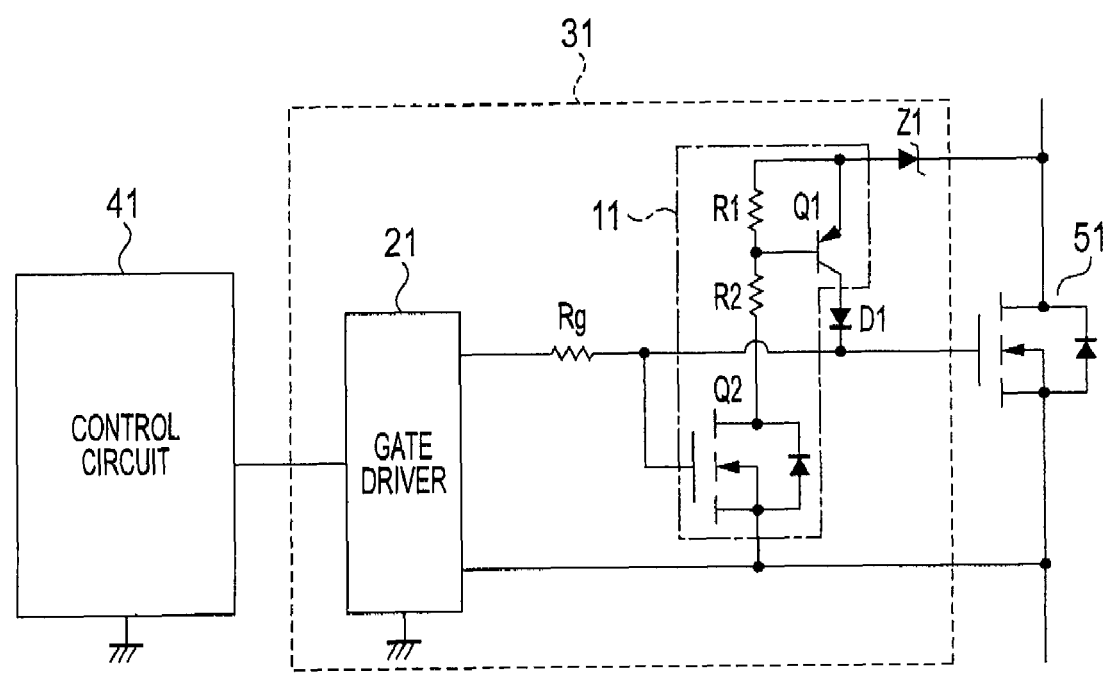
FIG. 2 is a circuit diagram in which the semiconductor switch circuit in FIG. 1 is replaced with a concrete circuit element.

FIG. 2 is a circuit diagram in which a block of the semiconductor switch circuit 11 shown in FIG. 1 is replaced with a concrete circuit element. The semiconductor switch circuit 11 has a multi-stage structure formed from a MOS-FET Q2 and a pnp type transistor Q1. An emitter terminal of the transistor Q1, which is at an output stage, is connected to the anode terminal of the voltage regulation diode Z1 while a collector terminal is connected to the anode terminal of the reverse blocking diode D1. A base terminal of the transistor Q1 is connected to a resistance R1 and a resistance R2. The other end of the resistance R1 is connected to the emitter terminal of the transistor Q1. The other end of the resistance R2 is connected to a drain terminal of the MOS-FET Q2. Moreover, a source terminal of the MOS-FET Q2 is connected to the source terminal of the power MOS-FET 51 while a gate terminal is connected to the gate terminal of the power MOS-FET 51. A selected on-threshold voltage of the MOS-FET Q2 (1 V, for example) is smaller in characteristic than the on-threshold voltage of the power MOS-FET 51 (4 V, for example).

Figure 3:
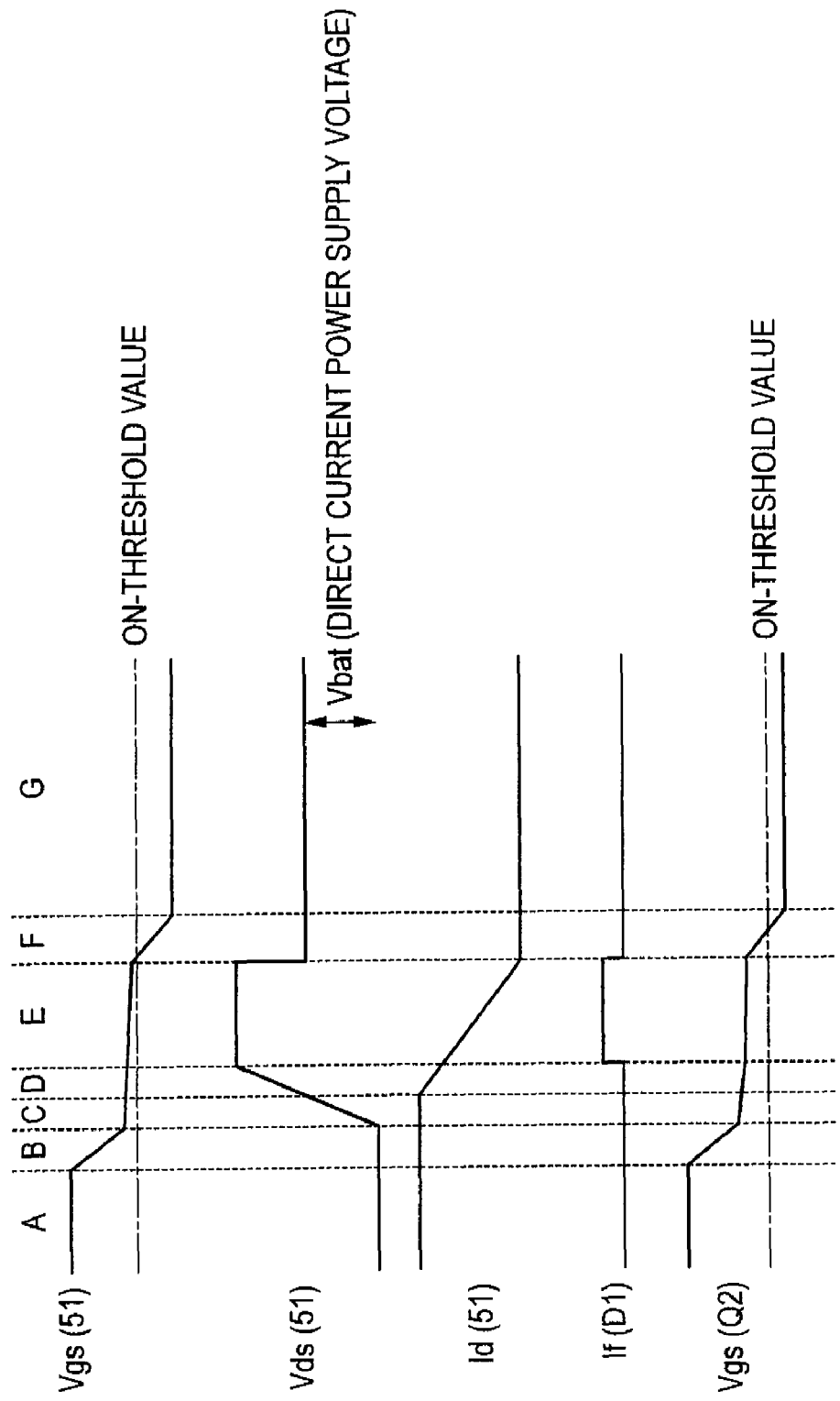
FIG. 3 shows an example of waveforms of a power MOS-FET driven by the gate drive circuit in FIG. 2 when the power MOS-FET switches from on to off.

FIG. 3 schematically shows an example of waveforms of respective parts of the power MOS-FET 51 driven by the gate drive circuit 31 in FIG. 2 when the power MOS-FET 51 switches from on to off. Vgs (51), Vds (51) and Id (51) denote the voltage between the gate and the source of the power MOS-FET 51, the voltage between the drain and the source and the drain current, respectively. "If (D1)" denotes a forward direction current of the reverse blocking diode. Vgs (Q2) denotes the voltage between the gate and the source of the MOS-FET Q2 (=Vgs (51)).

Now, described will be an operation of Embodiment 1 for every section shown in FIG. 3.

Section A: A gate driver 21 drives the power MOS-FET 51 to be turned on based on an instruction of "on" from the control circuit 41. A forward direction (a direction from a drain to a source) current flows from a direct current power supply not shown through a parasitic inductance Ldc of a direct current power supply line not shown. In this case, the transistor Q1 is off due to the resistance R1 since Vds (51) is sufficiently smaller than the breakdown voltage (the on-threshold voltage) of the voltage regulation diode Z1 although the MOS-FET Q2 is on. The reverse blocking diode D1 prevents a current from flowing into the semiconductor switch circuit 11.

Section B: A turn-off instruction is outputted from the control circuit 41. The gate driver 21 performs an on-drive in accordance with the instruction, so that Vgs (51) starts reduction. No switching occurs, however, until Vgs (51) reaches the voltage close to the on-threshold value.

Section C: When Vgs (51) reaches the voltage close to the on-threshold value, Vds (51) rises in accordance with a rapid rise of on-resistance of the power MOS-FET 51. At that time, a reduction rate of Vgs (51) suddenly drops to level off due to a mirror effect.

Section D: When Vds (51) exceeds the voltage of the direct current power supply, Id (51) starts decreasing. The surge voltage, which is fixed in accordance with a value obtained by multiplication of the reduction speed of Id (51) and the parasitic inductance Ldc of the direct current power supply line, is generated for Vds (51).

Section E: When the surge voltage of Vds (51) reaches the sum of the breakdown voltage of the voltage regulation diode Z1, the forward direction voltage of the reverse blocking diode D1 and Vgs (51) at that time, the MOS-FET Q2 is still on (since the on-threshold voltage of MOS-FET Q2 is smaller than the on-threshold voltage of the power MOS-FET 51). Accordingly, the breakdown current of the voltage regulation diode Z1 flows through the MOS-FET Q2 to a base current of the transistor Q1 to turn on the transistor Q1. On the other hand, If (D1) for adjusting the reduction rate of Vgs (51) so that the reduction rate of Id (51) would be constant flows from the drain tithe gate of the power MOS-FET 51 to reach a state of balance. As a result, the surge voltage due to the parasitic inductance Ldc of the direct current power supply line is limited to a predetermined value determined on the basis of the breakdown voltage of the voltage regulation diode Z1.

Section F: When Id (51) becomes zero and the power MOS-FET 51 absorbs all the energy of the parasitic inductance of the direct current power supply line, which is consumed by turning off the power MOS-FET 51, the power MOS-FET 51 is completely turned off. At that time, Vds (51) falls down to the voltage of the direct current power supply to be below the breakdown voltage of the voltage regulation diode Z1. This causes both of If (D1) and the base current of the transistor Q1 to be zero, and thereby, the transistor Q1 to be turned off due to the resistance R1. When Vgs (Q2) falls below the on-threshold value after the above, the MOS-FET Q2 is also turned off.

Section G: The gate driver 21 maintains an off state of the power MOS-FET 51 through the gate resistance Rg on the basis of an off signal from the control circuit 41. The transistor Q1 is similarly kept off since the MOS-FET Q2 is also kept off by means of the gate driver 21. Accordingly, If (D1) does not flow even in the case that Vds (51) exceeds the breakdown voltage of the voltage regulation diode Z1 in Section G. This causes no operation of turning on the power MOS-FET 51 to absorb the energy of the surge voltage.

Figure 4:
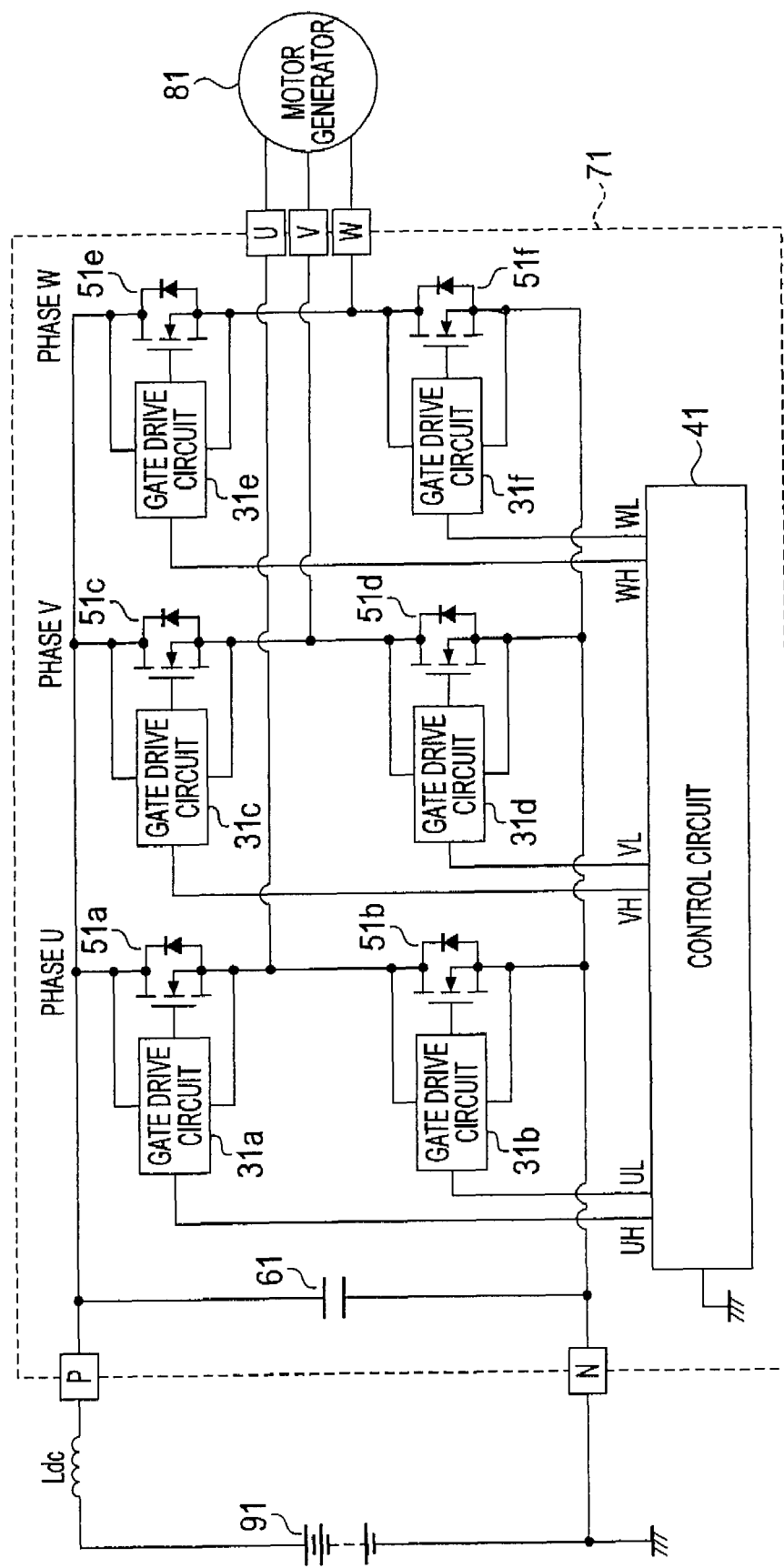
FIG. 4 illustrates a whole structure of a three-phase driving power generation system of a motor generator in accordance with embodiments of the invention.

Now, described will be a case that the gate drive circuit 31 in FIG. 2 is applied to a polyphase bridge type power converter. FIG. 4 illustrates a whole structure of a system in which direct current power of a battery 91 is converted into three-phase alternating current power by means of a power converter 71 to drive a motor generator 81 and in which the three-phase alternating current power generated by rotation of the motor generator 81 is rectified by means of the power converter 71 to be converted into the direct current power. Ldc denotes parasitic inductance of wiring of a direct current power supply line between the battery 91 and the power converter 71. A field system circuit, a sensor circuit and such are omitted from drawing. The power converter 71 is a three-phase bridge circuit comprising N-channel type power MOS-FETs 51a to 51f. The battery 91 is connected between a high voltage side direct current terminal P and a low voltage side direct current terminal N of the power converter 71.

Alternating current terminals U, V and W connected to middle points of respective phases (a phase U, a phase V and a phase W) of the three-phase bridge are respectively connected to stator windings U, V and W of the motor generator 81. A capacitor 61 is connected between the terminal P and the terminal N in order to absorb the energy of the parasitic inductance Ldc for a while in turning off the power MOS-FETs 51a to 51f to reduce the speed in rising of the generated surge voltage. The capacitor 61 plays a role of suppressing high frequency oscillation due to switching. The power MOS- FETs 51a to 51f are connected to the gate drive circuits 31a to 31f and further to a control circuit 40 upstream from the gate drive circuits. The insides of the gate drive circuits 31a to 31f are similar to the circuitry of the gate drive circuit 31 in FIG. 2. It is assumed that Z1a to Z1f denote respective voltage regulation diodes and that breakdown voltages of voltage regulation diodes Z1c and Z1d of the gate drive circuits 31c and 31d in the phase V are smaller than those of the voltage regulation diodes Z1a, Z1b, Z1e and Z1f in the other phases by several volts.

Figure 5:
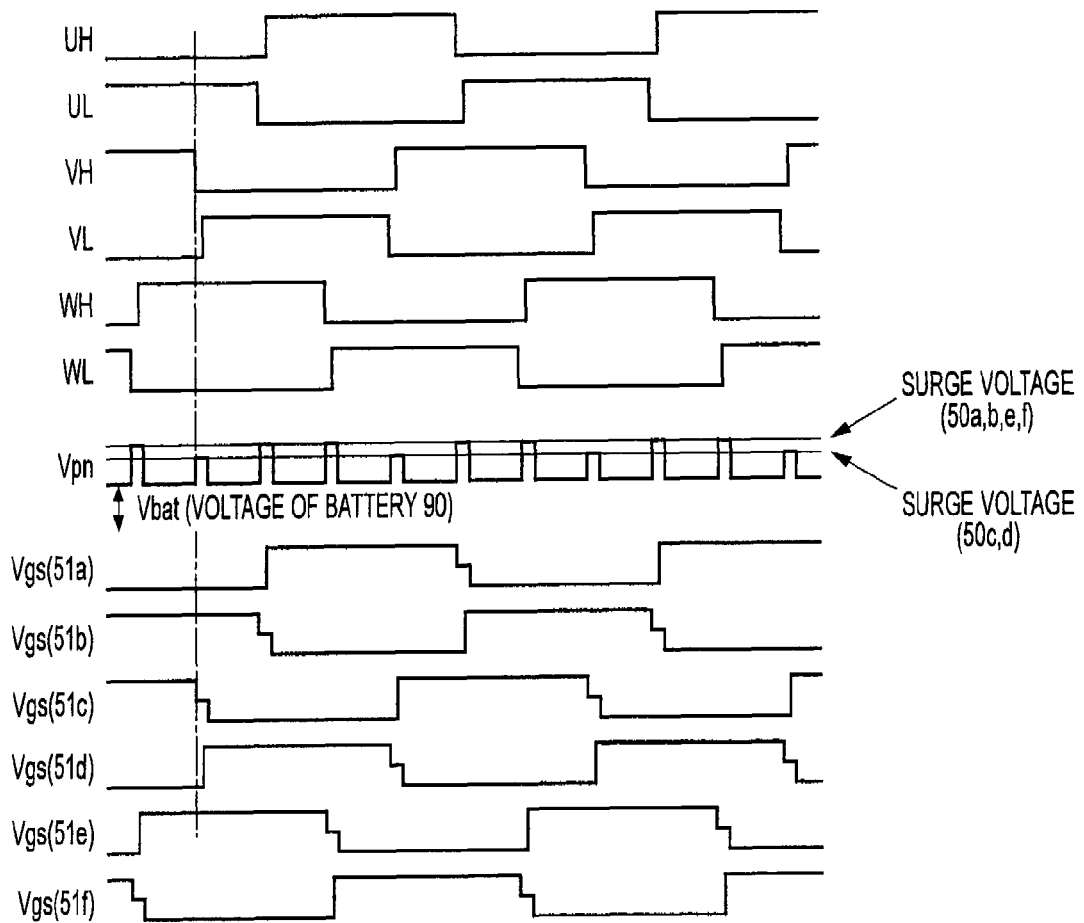
FIG. 5 shows operation waveforms in the case of driving the motor generator in FIG. 4.

FIG. 5 shows operation waveforms in the case that a rectangular wave control signal having an energizing angle of 180 degrees is outputted from the control circuit 41 and alternating current power having a predetermined frequency is given to the motor generator 81 for a drive in FIG. 4. UH, UL, VH, VL, WH and WL denote on-off control signals of the respective power MOS-FETs 51a to 51f, which are outputted from the control circuit 41. A signal at a high level means an instruction of "on" while a signal at a low level means an instruction of "off". Time for preventing short circuit (dead time) is provided in timing of switching on and off a control signal. Vpn denotes a voltage between the terminal P and the terminal N of the power converter 71. Vgs (51a), Vgs (51b), Vgs (51c), Vgs (51d), Vgs (51e) and Vgs (51f) respectively denote voltages between gates and sources of the power MOS-FETs 51a to 51f. A section of a middle voltage shows the gate drive circuits 31a to 31f operating so as to limit the surge voltage due to the parasitic inductance Ldc to a predetermined value.

Now, described will be an operation in FIG. 5. When Vgs (51c) decreases on the basis of an instruction of turning off in accordance with VH to turn off the power MOS-FET 50c, surge voltage due to the parasitic inductance Ldc is generated between the drain and the source of the power MOS-FET 51c while surge voltage at the substantially same level is generated for Vpn. The surge voltage exceeding the sum of the breakdown voltage of the voltage regulation diode Z1c of the gate drive circuit 31c and the forward direction voltage of the reverse blocking diode D1 causes Vgs (51c) to slowly decrease in the vicinity of an on-threshold value of the power MOS-FET 51c. The surge voltage is then limited to a predetermined level of the gate drive circuit 31c while the power MOS-FET 51c absorbs energy of the parasitic inductance Ldc. That is to say, the power MOS-FET 51c, which has been turned off, absorbs the energy of the parasitic inductance Ldc.

Similarly, also in turning off the power MOS-FETs 51a, 51b, 51d, 51e and 51f, the surge voltage is limited to a predetermined level of the gate drive circuit for controlling each power MOS-FET while the power MOS-FET, which has been turned off, per se absorbs energy of the parasitic inductance Ldc. Even in the case of existence of a gate drive circuit in another phase, which has low breakdown voltage of the voltage regulation diode, no electricity turns on to the transistor Q1 since the MOS-FET Q2 forming the gate drive circuit is off when the power MOS-FET 51 in the phase is off. Accordingly, the surge voltage applied to the power MOS-FET 51 exceeding the breakdown voltage of the voltage regulation diode causes no response to the surge voltage for being turned on when the phase is off while the surge voltage exceeding the breakdown voltage of the voltage regulation diode, per se, is applied to the power MOS-FET 51.

Therefore, in accordance with the structure of the gate drive circuit 31 in FIG. 2, the energy of the parasitic inductance Ldc to be consumed in turning off the power MOS-FET in an own phase is only absorbed even when the breakdown voltage of the voltage regulation diode Z1 forming the gate drive circuit 31 has dispersion, so that losses in the power MOS-FET 51a to 51f are evened. This can prevent a loss of a specific power MOS-FET from increasing to reach an overheat break. Further, uniform losses of the power MOS-FETs 51a to 51f cause a decrease in the maximum loss of a semiconductor switch forming the power converter. This allows a heat dissipation circuit of a power converter to be miniaturized.

Moreover, in accordance with the above-mentioned connecting relation between the voltage regulation diode element Z1, the reverse blocking diode element D1 and the semiconductor switch circuit 11, which form the gate drive circuit, an element other than the voltage regulating diode can be formed from an element pressure-resistant to the voltage of the gate control power supply (at most 20 V or less), however high the direct current power supply voltage is. Furthermore, using a MOS-FET to control a base terminal of a PNP transistor allows the consumption current of the gate drive power supply to be small. Accordingly, using a low-priced and small-sized circuit element having low pressure resistance and a small power rating can achieve the above-mentioned gate drive circuit.

Embodiment 2

Figure 6:
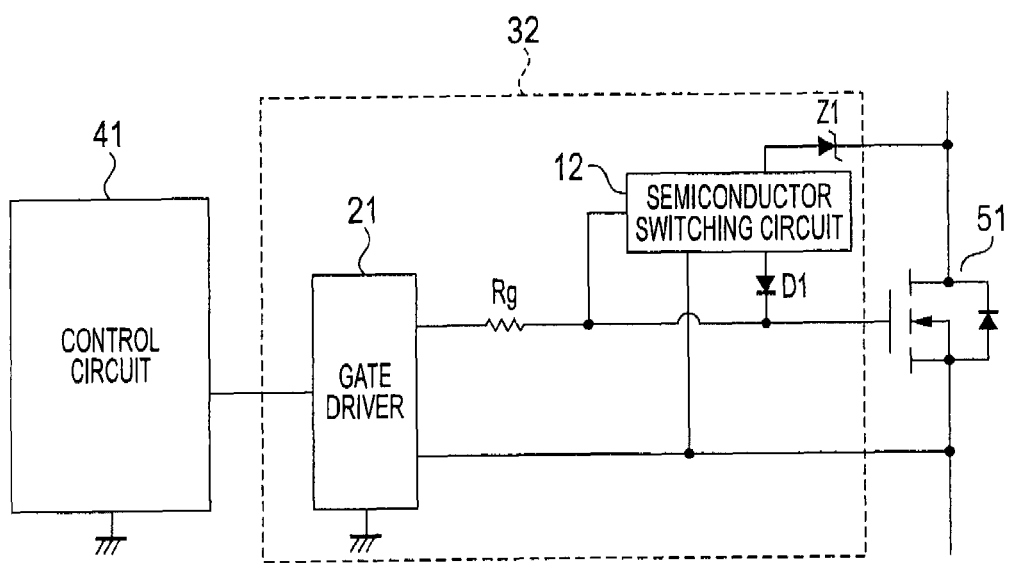
FIG. 6 is a block diagram showing a gate drive circuit of a semiconductor switch in accordance with Embodiment 2 of the invention and a peripheral structure thereof.
Figure 7:
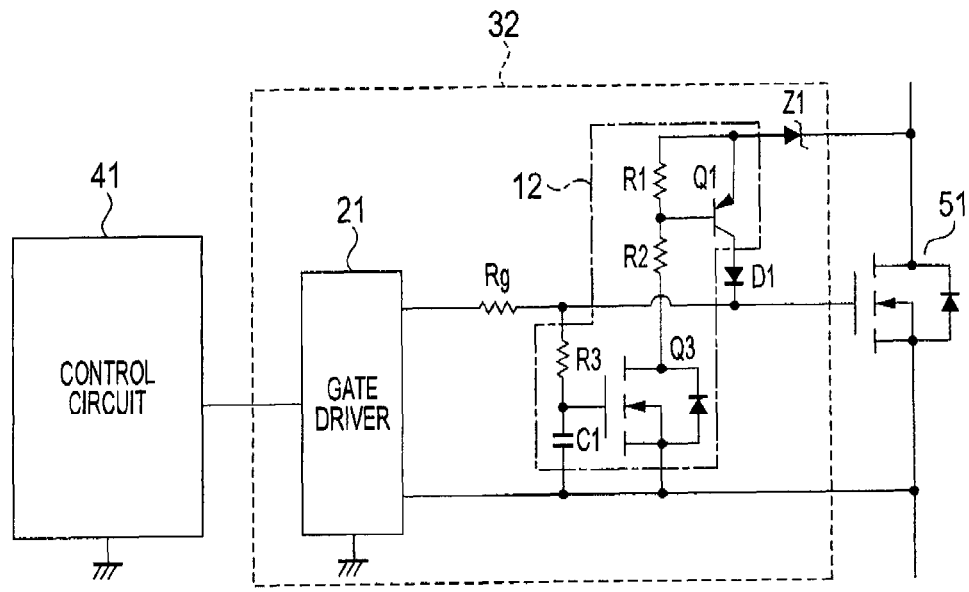
FIG. 7 is a circuit diagram in which the semiconductor switch circuit in FIG. 6 is replaced with a concrete circuit element.

FIG. 6 is a block diagram showing a gate drive circuit 32 of a semiconductor switch in accordance with Embodiment 2 of the invention and a peripheral structure thereof. In FIG. 6, extracted is a semiconductor switch portion forming a polyphase bridge type power converter. FIG. 7 is a circuit diagram in which a block of the semiconductor switch circuit 12 shown in FIG. 6 is replaced with a concrete circuit element. Embodiment 2 is different from Embodiment 1 in FIG. 2 in that a gate terminal of a MOS-FET Q3 is connected to the gate terminal of the power MOS-FET 51 not directly but through a resistance R3 and connected to the source terminal of the power MOD-FET 51 through a capacitor C1. The on-threshold voltage of the MOS-FET Q3 is assumed, in Embodiment 2, to be equal to or less than that of the power MOS-FET 51.

Embodiment 2 is effective in the case of necessity of suppressing high frequency oscillation due to switching of a semiconductor switch to reduce EMI noise, particularly, in the case that the capacity of the capacitor 61 in FIG. 4 is set at comparatively large capacity with respect to the value of the current to be switched, for example. The reason is as follows. The capacitor 61 absorbs the energy of the parasitic inductance Ldc for a while in turning off the power MPS-FET 51, so that the speed in rising of the surge voltage is reduced. Accordingly, in the case of using the gate drive circuit 31 in accordance with Embodiment 1 in FIG. 2, there may be a case that the gate voltage Vgs (Q2) of the MOS-FET Q2 is below the on-threshold value to turn off Q2 when the surge voltage reaches a predetermined value, which is a desired limit, so that the gate drive circuit 31 cannot suppress the surge voltage.

That is to say, the resistance R3 and the capacitor C1 of the gate drive circuit 32 in Embodiment 2 play a role as a delay filter for the voltage between a gate and a source of the MOS-FET Q3 for reduction in voltage between the gate and source in turning off the power MOS-FET 51. Therefore, a filter time constant of the resistance R3 and the capacitor C1 is set at the minimum value capable of keeping the MOS-FET Q3 on until the energy of the parasitic inductance Ldc is completely absorbed with the surge voltage in turning off the power MOS-FET 51 being limited to the predetermined value under any operating conditions. The minimum value is required because the MOS-FET Q3 going on to be on after the power MOS-FET 51 is completely turned off causes a phenomenon, which is same as the problem caused by the conventional gate drive circuit, for the surge voltage generated by turning off the semiconductor switch in the other phases. The capacitor C1 is assumed to be small enough to be ignorable with respect to a gate input capacity of the power MOS-FET 51 since it is a capacity load on the power supply of the gate driver 21. The resistance value of the resistance R3 is made large in order to adjust the filter time constant.

Figure 8:
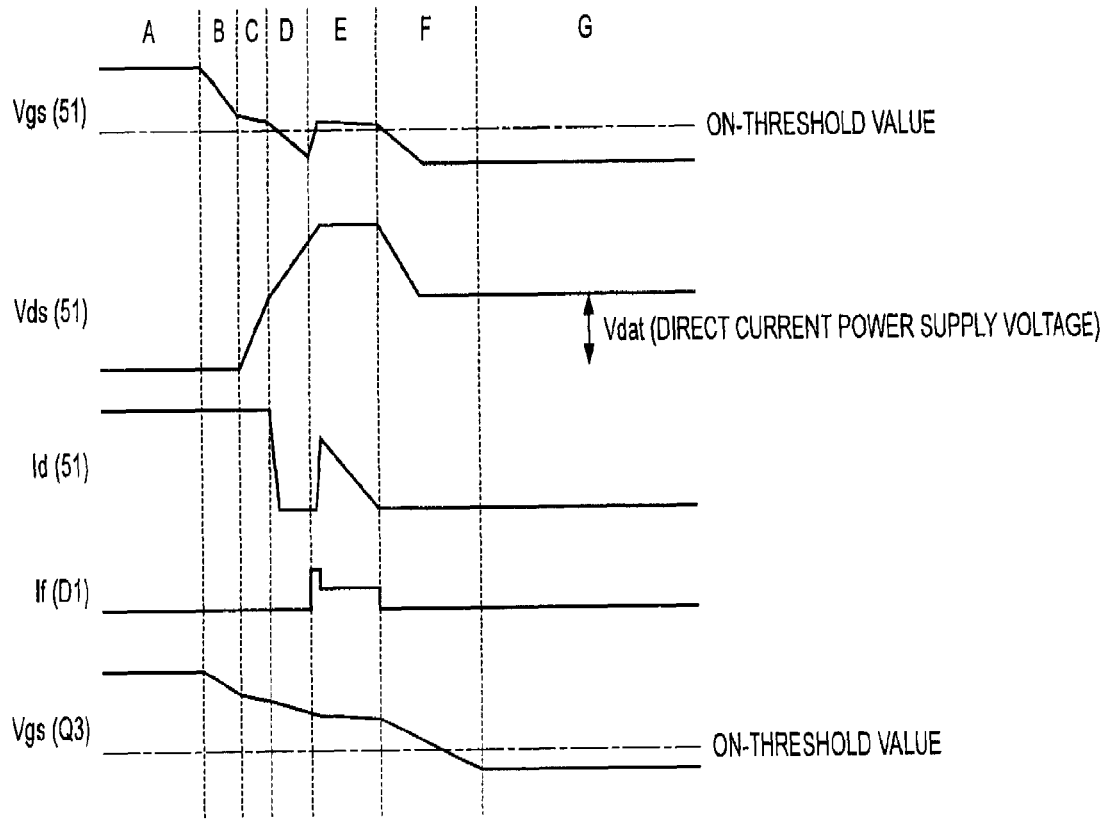
FIG. 8 shows an example of waveforms of a power MOS-FET driven by the gate drive circuit in FIG. 7 when the power MOS-FET switches from on to off.
Figure 9:
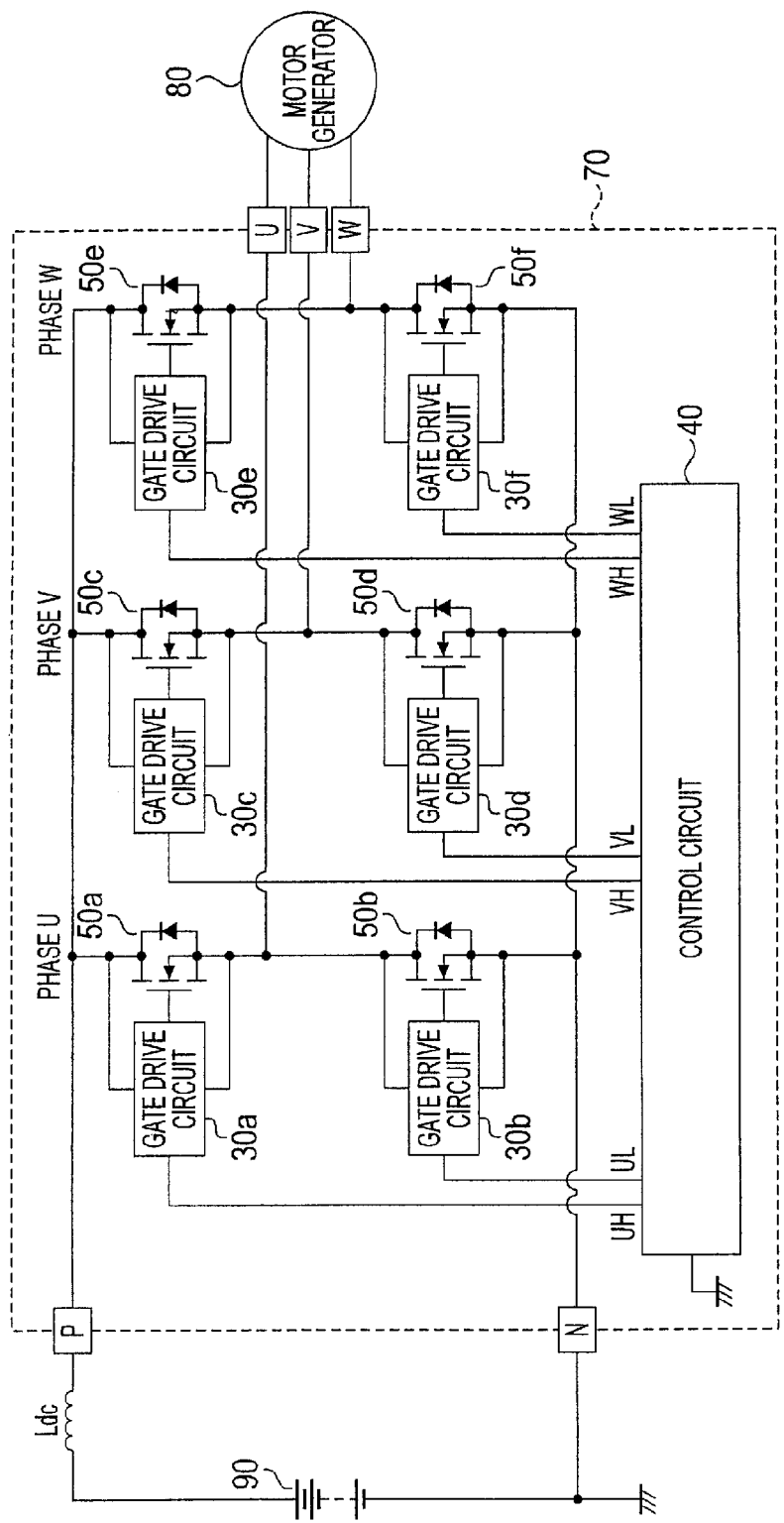
FIG. 9 illustrates a whole structure of a driving power generation system of a motor generator in accordance with a conventional example.
Figure 10:
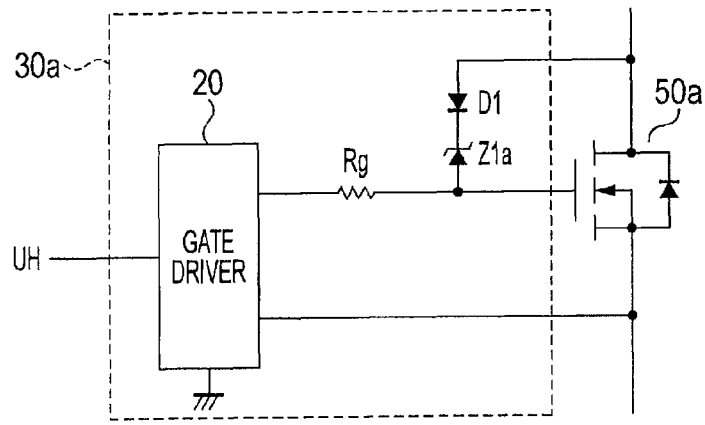
FIG. 10 is a circuit diagram showing an inner structure of the gate drive circuit in FIG. 9.
Figure 11:
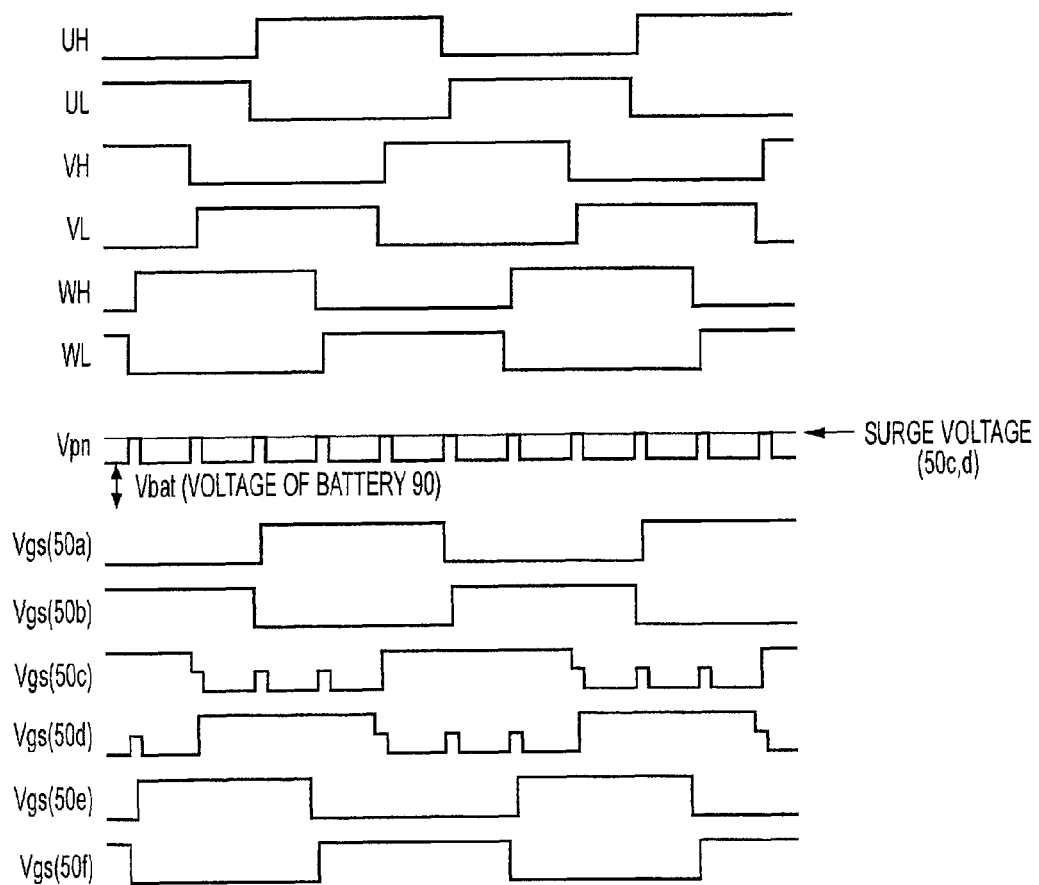
FIG. 11 shows operation waveforms in the case of driving the motor generator in FIG. 9.

FIG. 8 schematically shows an example of waveforms of the respective parts of the power MOS-FET 51 driven by the gate drive circuit 32 in FIG. 7 when the power MOS-FET 51 switches from on to off. In FIG. 8, it is assumed that a capacitor Cpn having comparatively large capacity with respect to the value of a current switching between the terminal P and the terminal N of the power converter is provided. Vgs (51), Vds (51) and Id (51) denote the voltage between the gate and the source of the power MOS-FET 51, the voltage between the drain and the source and the drain current, respectively. "If (D1)" denotes a forward direction current of the reverse blocking diode. Vgs (Q3) denotes the voltage between the gate and the source of the MOS-FET Q3.

Now, described will be an operation of every section, which is shown in FIG. 8, in Embodiment 2.

Section A: A gate driver 21 drives the power MOS-FET 51 to be turned on based on an instruction of "on" from the control circuit 41. A forward direction (a direction from a drain to a source) current flows from a direct current power supply not shown through a parasitic inductance Ldc of a direct current power supply line not shown. In this case, the transistor Q1 is off due to the resistance R1 since Vds (51) is sufficiently smaller than the breakdown voltage of the voltage regulation diode Z1 although the MOS-FET Q3 is on. The reverse blocking diode D1 prevents a current from flowing into the semiconductor switch circuit 12.

Section B: An off signal is outputted from the control circuit 41. The gate driver 21 performs an on-drive in accordance with the instruction, so that Vgs (51) starts reduction. No switching occurs, however, until Vgs (51) reaches the voltage close to the gate threshold value.

Section C: When Vgs (51) reaches the voltage close to the on-threshold value, Vds (51) rises in accordance with a rapid rise of on-resistance of the power MOS-FET 51. At that time, a reduction rate of Vgs (51) suddenly drops to level off due to a mirror effect.

Section D: When Vds (51) exceeds the voltage of the direct current power supply, the current due to the energy of the parasitic inductance Ldc flows into the capacitor Cpn for a while. Accordingly, Id (51) is rapidly reduced and the power MOS-FET 51 is completely turned off. The surge voltage waveform of Vds (51) slowly rises since it is substantially same as the waveform of the voltage between P and N in charging the capacity 61 with the energy of the parasitic inductance Ldc (it is assumed in the above case that the surge voltage due to parasitic inductance between the capacitor Cpn and the bridge circuit can be ignored).

Section E: When the surge voltage of Vds (51) reaches the sum of the breakdown voltage of the voltage regulation diode Z1, the forward direction voltage of the reverse blocking diode D1 and Vgs (51) at that time, the MOS-FET Q3 is still on due to a delay filter for a change in gate voltage of the resistance R3 and the capacitor C1. Accordingly, the breakdown current of the voltage regulation diode Z1 flows to a base of the transistor Q1 to turn on the transistor Q1. On the other hand, If (D1) flows from the drain to the gate of the power MOS-FET 51 to turn on the power MOS-FET 51 again, so that Id (51) increases again. After the above, If (D1) for adjusting the reduction rate of Vgs (51) so that the reduction rate of Id (51) would be constant flows to reach a state of balance. As a result, the surge voltage due to the parasitic inductance Ldc of the direct current power supply line is limited to a predetermined value determined on the basis of the breakdown voltage of the voltage regulation diode Z1.

Section F: When Id (51) has become zero and the power MOS-FET 51 absorbs all the energy of the parasitic inductance of the direct current power supply line, which is consumed by turning off the power MOS-FET 51, the power MOS-FET 51 completely turned off. At that time, Vds (51) falls down to the voltage of the direct current power supply to be below the breakdown voltage of the voltage regulation diode Z1. This causes both of If (D1) and the base current of the transistor Q1 to be zero, and thereby, the transistor Q1 to be turned off due to the resistance R1. Following to the above, Vgs (Q3) falls and the MOS-FET Q3 is also turned off in a short time.

Section G: The gate driver 21 maintains an off state of the power MOS-FET 51 through the gate resistance Rg on the basis of an off signal from the control circuit 41. The transistor Q1 is similarly kept off since the MOS-FET Q3 is also kept off by means of the gate driver 21. Accordingly, If (D1) does not flow even in the case that Vds (51) exceeds the breakdown voltage of the voltage regulation diode Z1 in Section G. This causes no operation of turning on the power MOS-FET 51 to absorb the energy of the surge voltage.

Now, described will be a case that the gate drive circuit 32 in FIG. 7 is applied to a polyphase bridge type power converter. Operating waveforms are similar to those in FIG. 5 in the case that the gate drive circuit 32 in FIG. 7 is applied to the respective parts of the gate drive circuits 31a to 31f in FIG. 4 and that a rectangular wave control signal having an energizing angle of 180 degrees is outputted from the control circuit 41 and alternating current power having a predetermined frequency is given to the motor generator 81 for a drive, similarly to Embodiment 1.

As described above, according to the gate drive circuit 32 shown in FIG. 7 in accordance with Embodiment 2, delaying a change of the gate voltage of a MOS-FET allows the state of "on" to be kept, and thereby, the surge voltage to be certainly limited to a predetermined voltage even in the case of a power converter in which surge voltage having a small value of dV/dt is generated, the surge voltage reaching the predetermined limit voltage after the voltage of a control terminal of a power semiconductor switch falls below the on-threshold value of the MOS-FET in turning off the MOS-FET, (such as a power converter provided with a capacitor having a comparatively large capacity between P and N for reducing EMI, for example) in addition to an effect same as that of Embodiment 1.

Further, the added capacity element C1 functions as a capacity load on the gate drive power supply. Accordingly, setting the capacity at a value sufficiently smaller than the gate input capacity of a power semiconductor switch and using a resistance element to adjust a time constant allow the consumption current of the gate drive power supply to be reduced.

In Embodiments 1 and 2 of the invention, used has been a three-phase bridge type power converter for description. The gate drive circuit in accordance with the invention, however, has the similar effect even when it is applied to an H bridge type (a two-phase bridge type) or a four or more phase bridge type power converter. Moreover, exemplified has been a drive of a motor generator using a rectangular wave control signal having an energizing angle of 180 degrees. The invention, however, is not limited to such a control method. The power MOS-FET 51 may be connected in parallel in the case of a power converter in which a large current flows. In addition, a semiconductor switch of a power converter may be another voltage drive type semiconductor switch such as an IGBT although a power MOS-FET has been used in the above description.

Furthermore, the transistor Q1 may be replaced with a P-channel type MOS-FET although it has been a pnp type transistor. The MOS-FET Q2 and MOS-FET Q3 also may be an npn type transistor. In view of a low price and reduction of load of the gate drive power supply, however, the optimum combination is disclosed in Embodiment 1 and 2 introduced above. When the resistance value of the gate resistance Rg is increased, a current flowing from the drain to the gate of the power MOS-FET 51 decreases in limiting the surge voltage to the predetermined value. This allows an element having a small power rating to be used for the respective elements of the gate drive circuit, so that the gate drive circuit can be miniaturized. Increasing the resistance value of the gate resistance Rg, however, causes an increase in switching loss. Accordingly, the resistance value of the gate resistance Rg is ideally increased as much as possible within a permissible range of an increase of the switching loss.

It should be understood that various kinds of modification and change of the invention are practically possible for a person skilled in the art within a range not deviating from the scope and spirit of the invention and the invention is not limited to the respective embodiments disclosed in the description.

The invention claimed is:

1. A bridge type power converter including:
plural stages of series-connected power semiconductor switches having first and second main terminals and a control terminal, the plural stages being connected in parallel; and
a gate drive circuit, which is connected between the first main terminal and the control terminal of a corresponding one of the power semiconductor switches and limits voltage between the first and second main terminals of the corresponding power semiconductor switch to a predetermined voltage value when only turning off the corresponding power semiconductor switch, the gate drive circuit comprising:
a voltage regulation diode element which is connected to the first main terminal of the corresponding power semiconductor switch and adjusts the predetermined voltage value,
a reverse blocking diode element which is connected to the control terminal of the corresponding power semiconductor switch and blocks a flow of a current from the control terminal to the first main terminal of the corresponding power semiconductor switch,
a first switch comprising a gate terminal connected to the control terminal of the corresponding power semiconductor switch, and
a second switch which is connected between the voltage regulation diode element and the reverse blocking diode element and comprises a base terminal connected to a drain terminal of the first switch,
wherein the first switch and the second switch are controlled based on a voltage value of the control terminal of the corresponding power semiconductor switch,
the second switch includes a pnp type transistor forming a switch at an output stage of the corresponding semiconductor switch circuit,
the first switch includes a MOS-FET forming a switch at an input stage of the corresponding semiconductor switch circuit and controlled to be turned on and off based on the voltage value of the control terminal of the corresponding power semiconductor switch,
the gate terminal of the MOS-FET is connected to a filter circuit including a resistance element and a capacity element, and
a time constant of the filter circuit is a time constant for maintaining on-voltage of the MOS-FET until the energy of parasitic inductance of a direct current power supply line, which is the energy to be absorbed by the corresponding power semiconductor switch when turning off the corresponding power semiconductor switch, is substantially absorbed.

2. The power converter according to claim 1, wherein:
an on-threshold voltage of the MOS-FET is smaller than an on-threshold voltage of the corresponding power semiconductor switch to maintain the ON state of the MOS-FET for the first time period and supply current from the voltage regulation diode element to the base terminal of the pnp transistor, and
the gate terminal of the MOS-FET is directly connected to the control terminal of the corresponding power semiconductor switch.

3. The power converter according to claim 1, wherein the capacity element has capacity substantially smaller than a gate input capacity of the corresponding power semiconductor switch.

4. The power converter according to claim 1, wherein the first switch is controlled to be in an ON state when the corresponding power semiconductor switch is controlled to be in an ON state and when subsequently the corresponding power semiconductor switch is controlled to be turned off for a first time period, and to be in an OFF state during remaining time.

5. The power converter according to claim 4, wherein the second switch is controlled to be in an ON state when the corresponding power semiconductor switch is controlled to be turned off subsequent to being in the ON state and to be in an OFF state during the remaining time.

6. The power converter according to claim 5, wherein the first switch and the second switch, while being controlled to be in the OFF state, facilitate to maintain the corresponding power semiconductor switch in an OFF state during turning off of other power semiconductor switches.

* * * * *